US005856756A

United States Patent [19]

Sasahara et al.

[11] Patent Number: 5,856,756

[45] Date of Patent: Jan. 5, 1999

[54] INTERNAL VOLTAGE GENERATING CIRCUIT

[75] Inventors: Katsuhiko Sasahara; Yuki Hashimoto, both of Tokyo, Japan

[73] Assignee: Oki Electric Industry Co., Ltd., Japan

[21] Appl. No.: 829,547

[22] Filed: Mar. 28, 1997

[30] Foreign Application Priority Data

Aug. 2, 1996 [JP] Japan .................................... 8-204369

[51] Int. Cl.[6] .............................. G05F 1/10; H03K 3/037

[52] U.S. Cl. ........................... 327/540; 327/545; 327/205

[58] Field of Search ..................................... 327/538, 540, 327/541, 543, 205, 206, 545, 546

[56] References Cited

U.S. PATENT DOCUMENTS 5,321,653 6/1994 Suh et al. ................................ 327/541
5,349,559 9/1994 Park et al. .............................. 327/541
5,448,199 9/1995 Park ........................................ 327/543

FOREIGN PATENT DOCUMENTS 6-96596 4/1994 Japan .

*Primary Examiner*—Toan Tran
*Attorney, Agent, or Firm*—Rabin & Champagne, P.C.

[57] ABSTRACT

An internal voltage generating circuit for generating an internal voltage VINT from an input external voltage VEXT is provided to stabilize the internal voltage. When the external voltage VEXT is less than or equal to a first boundary voltage VT1 or a second boundary voltage VT2 (>VT1), a constant voltage VINTN independent on the external voltage VEXT, which is produced by a constant voltage generator is outputted therefrom. When the external voltage VEXT is greater than or equal to the first boundary voltage VT1 or the second boundary voltage VT2, a variable voltage (>VINTN) linearly increased with an increase in VEXT, which is produced by a variable voltage generator, is outputted therefrom. When a detecting means detects that the external voltage VEXT has been increased to VT2 or higher, the characteristic of the internal voltage is switched from a constant voltage characteristic to a variable voltage characteristic. On the other hand, when the detecting means detects that the external voltage VEXT has been reduced to VT1 or lower, the characteristic of the internal voltage is changed from the variable voltage characteristic to the constant voltage characteristic.

17 Claims, 7 Drawing Sheets

Variation in Point (Boundary Voltage) for switching between voltage ranges with respect to temperatures Correction of Boundary Voltage $V_T$ With Respect To Temperature Variation Produced Internal Voltage Characteristics for the External Voltage of a Conventional Internal Voltage Generating Circuit

INTERNAL VOLTAGE GENERATING CIRCUIT

BACKGROUND OF THE INVENTION

1. Field of the Invention

This invention relates to an internal voltage generating circuit that is provided inside a semiconductor device and generates an internal voltage to be supplied to an internal circuit of the semiconductor device from an external voltage inputted from the outside.

2. Description of the Related Art

As a technique related to this type of internal voltage generating circuit, one is known which has been disclosed in, for example, Japanese Patent Application Laid-Open No. 6-96596 (Laid-Open Date: Apr. 8, 1994). FIG. 7 shows one example of an internal voltage vs. external voltage characteristic of a conventional internal voltage generating circuit. In FIG. 7, the internal voltage indicates such a constant voltage characteristic that when the external voltage ranges from 0 to a voltage VN (first voltage section or range), the external voltage is outputted as the internal voltage and when the external voltage ranges from the voltage VN to a boundary voltage VT (second voltage section or range), a constant voltage is outputted regardless of the external voltage. Further, the internal voltage indicates such a variable voltage characteristic that a voltage is outputted which vertically rises at the final stage of the second voltage range and linearly rises from the voltage that has risen at the final stage of the second voltage range in a section or range (third voltage range) in which the external voltage becomes greater than or equal to the boundary voltage VT.

With the objective of performing a screening test for an initial failure and a reliability test on newly-developed semiconductor devices, a burn-in test for applying a source voltage higher than normal specifications to manufactured semiconductor devices so as to activate them under high temperatures is applied to each manufactured semiconductor device. During the bum-in test, the semiconductor device is activated in the third voltage range. During the normal operation on the other hand, the semiconductor device is activated in the second voltage range. Whether the semiconductor device should be activated in the second voltage range or the third voltage range, is controlled according to the level of an applied external voltage. Further, the switching between the voltage ranges is carried out by changing the level of the external voltage.

However, in the conventional internal voltage generating circuit, when fluctuations occur in the external voltage due to the production of noise or the like in the vicinity of the boundary voltage VT corresponding to a point for switching from the second voltage range to the third voltage range or from the third voltage range to the second voltage range, the section or range of the internal voltage is not suitably set to either the second voltage range or the third voltage range and hence becomes unstable, thus resulting in the output of an unstable internal voltage from the internal voltage generating circuit

SUMMARY OF THE INVENTION

With the foregoing in view, it is therefore an object of the present invention to provide an internal voltage generating circuit capable of outputting a stable internal voltage therefrom.

In order to achieve the above object, the present invention provides an internal voltage generating circuit of the present invention for generating an internal voltage from an external voltage inputted thereto, which is characterized in that the internal voltage indicates such a constant voltage characteristic that the internal voltage is brought to a constant voltage regardless of the external voltage when the external voltage falls within a first voltage range, the internal voltage indicates such a variable voltage characteristic that when the external voltage falls within a second voltage range larger than the first voltage range, the internal voltage is brought to a variable voltage which is larger than the constant voltage and increases linearly with an increase in the external voltage, and a first boundary voltage for switching a characteristic of the internal voltage from the variable voltage characteristic to the constant voltage characteristic is lower than a second boundary voltage for switching the characteristic thereof from the constant voltage characteristic to the variable voltage characteristic Another invention provides an internal voltage generating circuit comprising:

a reference voltage generator for generating a reference voltage;

a constant voltage generator for generating the constant voltage corresponding to the level of the reference voltage from the external voltage;

a variable voltage generator for generating the variable voltage from the external voltage;

an output circuit for outputting an input voltage as an internal voltage; and detecting means for monitoring the level of the external voltage using the reference voltage, outputting a signal for determining either a first logical value or a second logical value, based on the result of monitoring, varying the determination signal from the first logical value to the second logical value when the detecting means detects that the external voltage has risen to the second boundary voltage or more, and varying the determination signal from the second logical value to the first logical value when the detecting means detects that the external voltage has been reduced to the first boundary voltage or less, and wherein when the determination signal is the first logical value, the constant voltage is inputted to the output circuit and when the determination signal is the second logical value, the variable voltage is inputted to the output circuit.

A further invention provides an internal voltage generating circuit wherein the detecting means includes, a voltage divider circuit for making a fraction of the external voltage in a first voltage division ratio when the determination signal is the first logical value, making a fraction of the external voltage in a second voltage division ratio when the determination signal is the second logical value and outputting either one of the resultant fractional voltages therefrom, and a comparing circuit for comparing the level of the input reference voltage and that of each fractional voltage, outputting the first logical value as the determination signal when the fractional voltage is less than or equal to the reference voltage and outputting the second logical value as the determination signal when the fractional voltage is greater than or equal to the reference voltage, and the voltage divider circuit sets the first voltage division ratio so that the fractional voltage becomes equal to the reference voltage when the external voltage is the second boundary voltage and is fractionated in the first voltage division ratio, and sets the second voltage division ratio so that the fractional voltage becomes equal to the reference voltage when the external voltage is the first boundary voltage and is fractionated in the second voltage division ratio.

A still further invention provides an internal voltage generating circuit wherein the voltage divider circuit is able to freely set the dependence of the voltage division ratio on temperature.

A still further invention provides an internal voltage generating circuit wherein the voltage divider circuit includes, a voltage division load circuit wherein three or more load elements are connected in series, one ends of the load elements are respectively connected to the external voltage and a ground voltage and any of points at which the load elements are joined to each other, is used as a terminal for outputting the fractional voltage, whereby the external voltage is fractionated or fractionally divided by an external source-side load circuit extending from the external voltage to the output terminal and a ground source-side load circuit extending from the output terminal to the ground voltage, and a switch circuit for short-circuiting or opening between terminals of a predetermined above load element in accordance with the determination signal to thereby set a voltage division ratio of the voltage division load circuit to the first or second voltage division ratio.

A still further invention provides an internal voltage generating circuit wherein the voltage division load circuit uses resistors as the load elements.

A still further invention provides an internal voltage generating circuit wherein the voltage division load circuit is able to freely set the dependence of the voltage division ratio on temperature by forming the resistor of the external source-side load circuit and the resistor of the ground source-side load circuit from resistive materials of two types or more, which are different in temperature coefficient from each other.

A still further provides an internal voltage generating circuit wherein the voltage division load circuit includes a plurality of resistors uncontrolled by the switch circuit, which are respectively provided for the external source-side load circuit and the ground source-side load circuit, and is able to freely set the dependence of the voltage division ratio on temperature by respectively forming the plurality of resistors from resistive materials of two types or more, which are different in temperature coefficient from each other.

A still further invention provides an internal voltage generating circuit wherein the voltage division load circuit uses polysilicon and an n- or p-type silicon diffusion layer as the resistive materials.

A still further invention provides an internal voltage generating circuit wherein the switch circuit has one or a plurality of short-circuit switch elements connected in parallel with the load elements to be short-circuited of the voltage division load circuit and is activated so as to bring the short-circuit switch elements into conduction or non-conduction in accordance with the determination signal.

A still further invention provides an internal voltage generating circuit wherein the switch circuit uses a MOS transistor as the short-circuit switch element.

A still further invention provides an internal voltage generating circuit wherein the voltage divider circuit further includes adjusting fuses for short-circuiting between the terminals of the predetermined load element of the load elements and is able to adjust the voltage division ratio of the voltage division load circuit by cutting out any of the adjusting fuses.

A still further invention provides an internal voltage generating circuit wherein the comparing circuit includes, a comparator having an inverse input terminal and a non-inverse input terminal respectively supplied with the reference voltage and the fractional voltage, and a drive circuit driven in response to a signal outputted from the comparator so as to output the determination signal.

A still further invention provides an internal voltage generating circuit wherein the variable voltage generator has an output terminal connected to an input terminal of the output circuit and is activated so as to output the variable voltage to the output circuit when the determination signal is the second logical value and deactivated so as to stop the output of the variable voltage to the output circuit when the determination signal is the first logical value and the constant voltage generator has an output terminal connected to the input terminal of the output circuit and is activated so as to output the constant voltage to the output circuit when the variable voltage generator stops outputting and deactivated so as to stop the output of the constant voltage to the output circuit when the variable voltage generator is activated.

A still further invention provides an internal voltage generating circuit wherein the variable voltage generator includes, a switch element having a control terminal inputted with the determination signal, which is opened when the determination signal is the first logical value and is brought into conduction when the determination signal is the second logical value, and a step-down load element connected in series with the switch element, and the constant voltage generator includes, a differential amplifier having an inverse input terminal supplied with the reference voltage, a first step-up load element provided between a non-inverse terminal of the differential amplifier and the input terminal of the output circuit, a second step-up load element provided between the non-inverse terminal of the differential amplifier and a ground voltage, and a PMOS transistor whose gate, source and drain electrodes are respectively connected to an output terminal of the differential amplifier, the external voltage and the input terminal of the output circuit, said PMOS transistor being cut off when the switch element is brought into conduction so as to activate the constant voltage generator.

Thus, according to the internal voltage generating circuit of the present invention, a hysteresis characteristic is imparted to an internal voltage by switching a characteristic of an internal voltage from a constant voltage characteristic to a variable voltage characteristic when an external voltage is of a second boundary voltage and switching the characteristic of the internal voltage from the variable voltage characteristic to the constant voltage characteristic when the external voltage is of a first boundary voltage smaller than the second boundary voltage. As a result, the internal voltage, which has first entered into the variable voltage characteristic from the constant voltage characteristic, is prevented from being returned to the constant voltage characteristic due to fluctuations in external voltage. Further, the internal voltage, which has first entered into the constant voltage characteristic from the variable voltage characteristic, is prevented from being returned to the variable voltage characteristic due to the fluctuations in external voltage. Moreover, even when the external voltage is unstable in the vicinity of the switching between the characteristics, the internal voltage can be stably outputted. An external voltage section or range for providing the constant voltage characteristic and an external voltage section or range for providing the variable voltage characteristic can be both enlarged as compared with the prior art.

Further, according to the internal voltage generating circuit of another invention, variations in first and second boundary voltages with respect to temperatures due to a variation in reference voltage with respect to the temperature can be corrected by freely setting the dependence of a voltage division ratio of a voltage divider circuit on the temperature.

Moreover, according to the internal voltage generating circuit of the further invention, a voltage division ratio of a voltage division load circuit can be adjusted by opening or cutting out adjusting fuses so as to free short-circuiting of a predetermined load element.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
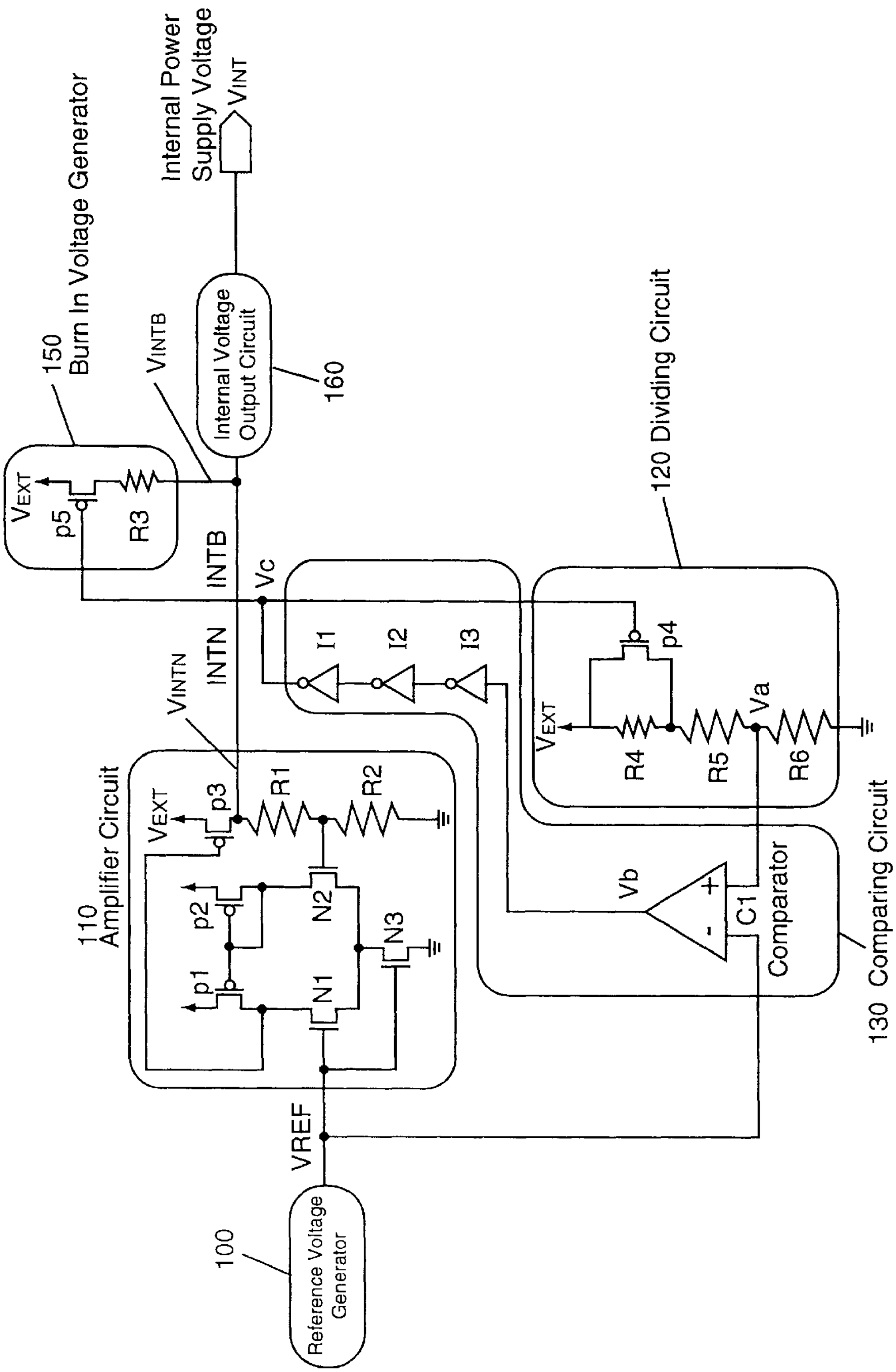
FIG. 1 is a diagram showing a circuit configuration of an internal voltage generating circuit according to a first embodiment of the present invention.

FIG. 1 shows an internal voltage generating circuit according to a first embodiment of the present invention. The internal voltage generating circuit comprises a reference voltage generator 100, an amplifier circuit 110 which serves as a constant voltage generator, a voltage divider circuit 120, a comparing circuit 130, a burn-in voltage generator 150 which serves as a variable voltage generator, and an internal voltage output circuit 160.

The reference voltage generator 100 is a circuit for generating a predetermined reference voltage VREF independent on an external voltage. The reference voltage VREF ranges from 1.3[V] to 1.4[V], for example.

The amplifier circuit 110 includes a differential amplifier which is composed of an NMOS transistor N1 whose gate electrode is supplied with the reference voltage VREF, an NMOS transistor N2 whose source electrode is electrically connected to a source electrode of the NMOS transistor N1 and which forms a differential pair together with the NMOS transistor N1, an NMOS transistor N3 activated as a constant current source, which has gate and drain electrodes respectively electrically connected to the gate electrode of the NMOS transistor N1 and the source electrode of the NMOS transistor N1 and has a source electrode electrically grounded, a PMOS transistor P1 whose source and drain electrodes are respectively electrically connected to an external voltage VEXT and a drain electrode of the NMOS transistor N1, and a PMOS transistor P2 whose gate, drain and source electrodes are respectively electrically connected to the gate electrode of the NMOS transistor P1, a drain electrode of the NMOS transistor N2 and the external voltage VEXT, whose gate and drain electrodes are commonly connected to each other and which forms a load pair together with the PMOS transistor P1, and which uses the drain electrode of the NMOS transistor N1 as an output terminal. Further, the amplifier circuit 110 has a PMOS transistor P3 whose gate and source electrodes are respectively electrically connected to the drain electrode of the NMOS transistor N1 and the external voltage VEXT, a resistor R1 (corresponding to a first boost or set-up load element) provided between the drain electrode of the PMOS transistor P3 and a gate electrode of the NMOS transistor N2, and a resistor R2 (corresponding to a second set-up load element) provided between the gate electrode of the NMOS transistor N2 and a ground voltage. The amplifier circuit 110 uses the drain electrode of the PMOS transistor P3 as an output terminal INTN and generates a constant voltage VINTN, independent of the external voltage VEXT, corresponding to the level of the reference voltage VREF from the output terminal INTN. At this time, $VINTN = VREF \times (R1+R2)/R2$. This VINTN is 3.3[V], for example.

The voltage divider circuit 120 has a voltage division load circuit wherein resistors R4, R5 and R6 are connected in series in this order, one end of the resistor R4 is electrically connected to the external voltage VEXT, one end of the resistor R6 is electrically grounded and a point at which the resistors R5 and R6 are joined to each other, is used as a terminal for outputting a fractionally-divided voltage Va, whereby a fraction of the external voltage VEXT available is made by an external source-side load circuit composed of the resistors R4 and R5 and a ground source-side load circuit composed of the resistor R6, and a PMOS transistor P4 used as a switch circuit connected in parallel to the resistor R4 so as to short-circuit or open the resistor R4. When the transistor P4 is in an OFF state, the voltage divider circuit 120 makes a fraction of the external voltage VEXT in a voltage division ratio (first voltage division ratio) determined by the ratio between the total resistance value of the series-connected resistors R4 and R5 and the resistance value of the resistor R6. On the other hand, when the transistor P4 is in an ON state, the voltage divider circuit 120 makes a fraction of the external voltage VEXT in a voltage division ratio (second voltage division ratio) determined by the ratio between the resistance values of the resistors R5 and R6. A voltage Va1 obtained by making the fraction of the external voltage VEXT in the first voltage division ratio becomes $VEXT \times R6/(R4+R5+R6)$ and a voltage Va2 obtained by making the fraction of the external voltage VEXT in the second voltage division ratio becomes $VEXT \times R6/(R5+R6)$. The respective resistance values of R4, R5 and R6 are set so that Va2 ($= VT1 \times R6/(R5+R6)$) at the time that the external voltage VEXT is a first boundary voltage VT1 and Va1

(=VT2×R6/(R4+R5+R6)) at the time that the external voltage VEXT is a second boundary voltage VT2, are both equal to VREF. Preset values of VT1 and VT2 are respectively 6.55[V] and 6.85[V], for example (i.e., VT1=6.55[V] and VT2=6.85[V]).

The comparing circuit 130 includes a comparator C1 having an inverse input terminal (−) supplied with the reference voltage VREF and a non-inverse input terminal (+) supplied with the voltage Va, and a drive circuit of a type wherein inverters I1, I2 and I3 are electrically connected in series and an output terminal of the inverter I2 is electrically connected to the gate electrode of the PMOS transistor P4 of the voltage divider circuit 120. The comparator C1 compares the level of the reference voltage VREF with that of the voltage Va. If Va<VREF, then the comparator C1 outputs an output voltage Vb of a logical level "Low" (hereinafter expressed as "L") therefrom. If Va≧VREF, then the comparator C1 outputs an output voltage Vb of a logical level "High" (hereinafter represented as "H") therefrom. The drive circuit outputs a determination or decision voltage Vc brought to "H" (corresponding to a first logical value) when Vb is of "L" and a decision voltage Vc brought to "L" (corresponding to a second logical value) when Vb is of "H". The PMOS transistor P4 of the voltage divider circuit 120 is turned OFF when Vc="H", whereas it is turned ON when Vc="L".

The burn-in voltage generator 150 includes a PMOS transistor P5 whose gate electrode is supplied with the decision voltage Vc and whose source electrode is electrically connected to the external voltage VEXT, and a resistor R3 provided between a drain electrode of the PMOS transistor P5 and the output terminal INTN of the amplifier circuit 110. Further, the burn-in voltage generator 150 uses a terminal of the resistor R3 on the amplifier circuit 110 side as an output terminal INTB. When the PMOS transistor P5 is turned ON, the burn-in voltage generator 150 is activated so as to output a burn-in voltage (variable voltage) VINTB having a value larger than the constant voltage VINTN of the amplifier circuit 110 from the output terminal INTB. At this time, VINTB=VEXT×(R1+R2)/(R1+R2+R3). Thus, it can be seen that the resistor R3 serves as a step-down load element since the burn-in voltage decreases with an increase in R3, and resistors R1 and R2 serve as step-down load elements since the burn-in voltage increases with an increase in either of resistors R1 and R2. When the burn-in voltage generator 150 is activated so that the voltage applied to the output terminal INTN of the amplifier circuit 110 is boosted to VINTB referred to above, the PMOS transistor P3 is turned OFF so that the amplifier circuit 110 stops the output of the constant voltage VINTN therefrom.

The internal voltage output circuit 160 is of a circuit for supplying the constant voltage VINTN inputted from the amplifier circuit 110 or the burn-in voltage VINTB inputted from the burn-in voltage generator 150 to an internal circuit (not shown) as an internal voltage VINT.

Incidentally, the voltage divider circuit 120 and the comparing circuit 130 constitute a detecting means. When the detecting means detects that the external voltage VEXT has been boosted to the second boundary voltage VT2 or more, the detecting means changes the decision voltage Vc from "H" to "L". On the other hand, when the detecting means senses that the external voltage VEXT has been reduced to the first boundary voltage VT1 or less, the detecting means changes the decision voltage Vc from "L" to "H".

Figure 2:
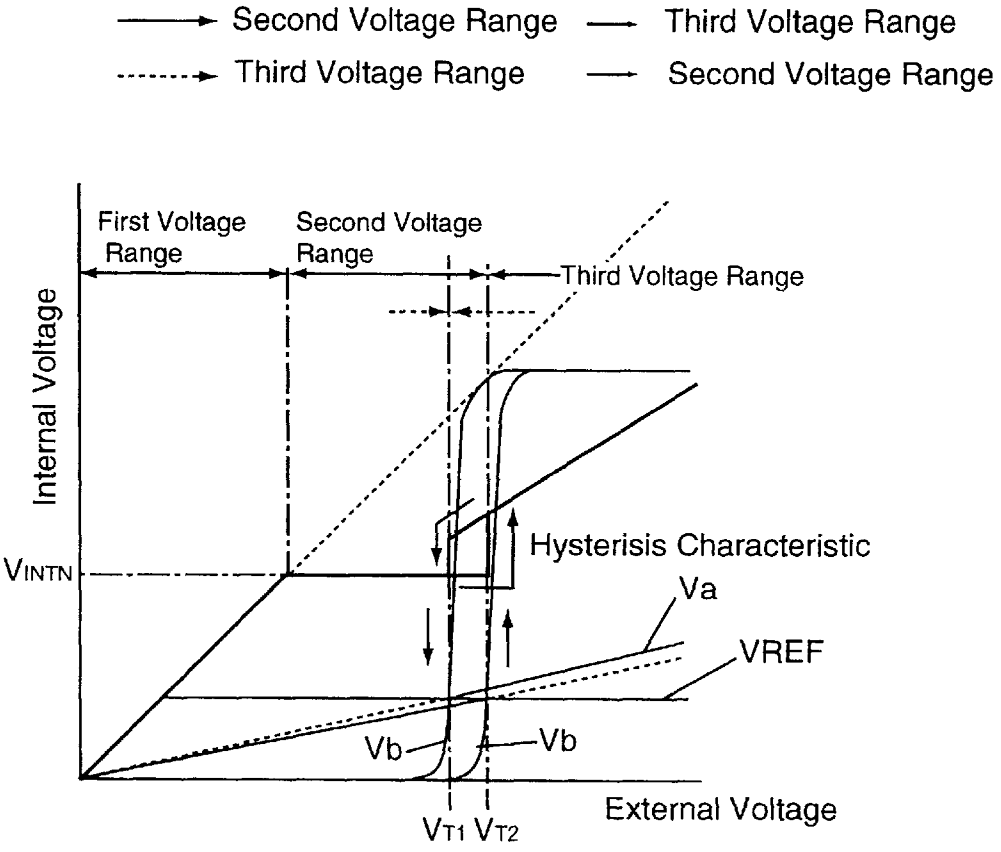
FIG. 2 is a diagram illustrating an output voltage characteristic obtained by the first embodiment shown in FIG. 1.

The operation of the internal voltage generating circuit shown in FIG. 1 will next be described. FIG. 2 is a diagram showing an input/output voltage characteristic of the internal voltage generating circuit shown in FIG. 1, i.e., an internal voltage VINT vs. external voltage VEXT characteristic. Referring to FIG. 1, a first voltage section or range corresponding to 0≦VEXT<VEXTN (=VINTN) corresponds to a section or range in which the external voltage VEXT is outputted as the internal voltage VINT. A second voltage range in which VEXTN≦VEXT<VT1 upon a reduction in VEXT and VEXTN≦VEXT<VT2 upon an increase in VEXT, corresponds to a constant voltage characteristic zone or region in which the constant voltage VINTN is outputted regardless of the external voltage VEXT. A third voltage range in which VT1<VEXT upon the reduction in VEXT and VT2<VEXT upon the increase in VEXT, corresponds to a variable voltage characteristic region in which the burn-in voltage VINTB (>VINTN) proportional to the external voltage VEXT is outputted. Thus, the boundary voltage VT2 at which a constant voltage characteristic is changed to a variable voltage characteristic with the increase in VEXT, is different from the boundary voltage VT1 at which the variable voltage characteristic is changed to the constant voltage characteristic with the drop in VEXT. The internal voltage VINT has a hysteresis characteristic with respect to the external voltage VEXT (only the switching between the second voltage range and the third voltage range at the time of the increase in external voltage and the switching between the second voltage range and the third voltage range at the time of the decrease in external voltage are different from each other in the internal voltage generating circuit shown in FIG. 1). Incidentally, FIG. 2 also illustrates characteristics of the reference voltage VREF, the voltage Va and the output voltage Vb of the comparator Cl with respect to the external voltage VEXT simultaneously with the above characteristics.

In the first voltage range, the PMOS transistor P5 of the burn-in voltage generator 150 is turned OFF and the PMOS transistor P3 of the amplifier circuit 110 is turned ON. Thus, the external voltage VEXT is outputted as the internal voltage VINT as it is through the PMOS transistor P3 and the internal voltage output circuit 160.

The operation of the internal voltage generating circuit at the constant voltage characteristic region corresponding to the second voltage range will first be described. In this range, the amplifier circuit 110 applies a voltage (corresponding to a voltage applied to the drain electrode of the NMOS transistor N1) outputted from the differential amplifier to the gate electrode of the PMOS transistor P3 in response to a variation in external voltage VEXT so as to activate the PMOS transistor P3 as a constant current source, thereby producing a constant voltage VINTN (=VREF×(R1+R2)/R2) independent on the external voltage VEXT. The constant voltage VINTN is input to the internal voltage output circuit 160 from which VINTN is supplied to the internal circuit as the internal voltage VINT. At this time, the fractional voltage Va outputted from the voltage divider circuit 120 is always Va<VREF. Further, the output voltage Vb of the comparing circuit 130 is "L" and the decision voltage Vc is "H". Thus, the PMOS transistors P4 and P5 are held OFF and the burn-in voltage generator 150 is placed in a deactivated state. Further, the voltage Va is represented as Va=Va1=VEXT×R6/(R4+R5+R6).

The operation (corresponding to the operation of the internal voltage generating circuit in a hysteresis characteristic region at the time of an increase in VEXT) of the internal voltage generating circuit, for performing switching from the second voltage range to the third voltage range with the increase in external voltage VEXT will next be described. When the external voltage VEXT increases beyond the boundary voltage VT1 so as to reach the second boundary voltage VT2 or more thereby to obtain the relations in Va (=Va1))>VREF, the output voltage Vb of the comparator C1 is inverted from “L” to “H” and the decision voltage Vc is changed from “H” to “L” in response to its inversion. As a result, the PMOS transistor P5 is turned ON to activate the burn-in voltage generator 150, whereby the switching from the second voltage range to the third voltage range is performed. Namely, the burn-in voltage generator 150 generates a burn-in voltage VINTB (=VEXT×(R1+R2)/(R1+R2+R3)) larger than VINTN from the output terminal INTB. Thus, the internal voltage output circuit 160 raises the internal voltage VINT and supplies the burn-in voltage VINTB to the internal circuit as VINT. At this time, the burn-in voltage VINTB is also applied to the output terminal INTN of the amplifier circuit 110 so that the voltage applied to the gate electrode of the NMOS transistor N2 is raised to increase the drain voltage of the NMOS transistor N1. Thus, the PMOS transistor P3 is turned OFF to deactivate the amplifier circuit 110. At this time, the PMOS transistor P4 is turned ON to short-circuit the resistor R4. As a result, the fractionally-divided voltage Va is changed from Va1 to Va2=VEXT×R6/(R5+R6).

The operation of the internal voltage generating circuit under the burn-in (variable voltage) voltage characteristic in the third voltage range will next be described. Since Va (=Va2)≧VREF at all times in this range, the output voltage Vb of the comparator C1 is maintained at “H”. Thus, since the decision voltage Vc produced from the comparing circuit 130 is held at “L”, the burn-in voltage generator 150 is always activated. Therefore, the burn-in voltage generator 150 supplies a burn-in voltage VINTB (=VREF×(R1+R2)/(R1+R2+R3)) proportional to the external voltage VEXT to the internal voltage output circuit 160. The internal voltage output circuit 160 supplies VINTB to the internal circuit as the internal voltage VINT. Further, since the amplifier circuit 110 is deactivated because the PMOS transistor P3 is in an OFF state, and the PMOS transistor P4 in the voltage divider circuit 120 is held ON to short-circuit the resistor R4, the fractionally-divided voltage Va remains at Va2 (=VEXT×R6/(R5+R6) at all times.

The operation (corresponding to the operation of the internal voltage generating circuit in the hysteresis characteristic region at the time of a decrease in VEXT) of the internal voltage generating circuit, for performing switching from the third voltage range to the second voltage range with the decrease in external voltage VEXT will finally be described. When the external voltage VEXT decreases below the second boundary voltage VT2 so as to reach the first boundary voltage VT1 or lower thereby to obtain the relations in Va (=Va2)<VREF, the output voltage Vb of the comparator C1 is inverted from “H” to “L” and the decision voltage Vc is changed from “L” to “H” in response to it. As a result, the PMOS transistor P5 is turned OFF to deactivate the burn-in voltage generator 150, whereby the switching from the third voltage range to the second voltage range is performed. Namely, the PMOS transistor P3 is freed from the OFF state owing to the deactivation of the burn-in voltage generator 150 to thereby activate the amplifier circuit 110. As a result, the amplifier circuit 110 generates the constant voltage VINTN at the output terminal INTN thereof. Thus, the internal voltage output circuit 160 reduces the internal voltage VINT and supplies VINTN to the internal circuit as VINT. At this time, the PMOS transistor P4 is turned OFF to open the resistor R4, so that the fractionally-divided voltage Va is switched from Va2 to Va1.

Thus, when the external voltage VEXT is of the second boundary voltage VT2, the internal voltage generating circuit shown in FIG. 1 performs the switching from the second voltage range to the third voltage range from the comparison between the fractionally-divided voltage Va1 (=VEXT×R6/(R4+R5+R6)) based on the first voltage division ratio of the voltage divider circuit 120 and the reference voltage VREF. Further, when the external voltage VEXT is of the first boundary voltage VT1 (<VT2), the internal voltage generating circuit performs the switching from the third voltage range to the second voltage range from the comparison between the fractionally-divided voltage Va2 (=VEXT×R6/(R5+R6)) based on the second voltage division ratio and the reference voltage VREF. Namely, the external voltage changed from the third voltage range to the second voltage range is set lower than the external voltage changed from the second voltage range to the third voltage range so that the switching between the second voltage range and the third voltage range is provided with the hysteresis characteristic.

According to the first embodiment as described above, the voltage division ratio of the voltage divider circuit 120 is changed to lower the external voltage point changed from the third voltage range to the second voltage range as compared with the external voltage point switched from the second voltage range to the third voltage range, thereby providing the switching between the second voltage range and the third voltage range with the hysteresis characteristic. As a result, the internal voltage, which has first entered into the third voltage range from the second voltage range, is prevented from immediately returning to the second voltage range and the internal voltage, which has first entered into the second voltage range from the third voltage range, is prevented from immediately returning to the third voltage range. Further, even when the external voltage is unstable in the vicinity of the switching between the voltage ranges, the internal voltage can be stably outputted. Moreover, the second voltage range and the third voltage range can be both enlarged by the provided hysteresis characteristic as compared with the prior art.

Figure 3:
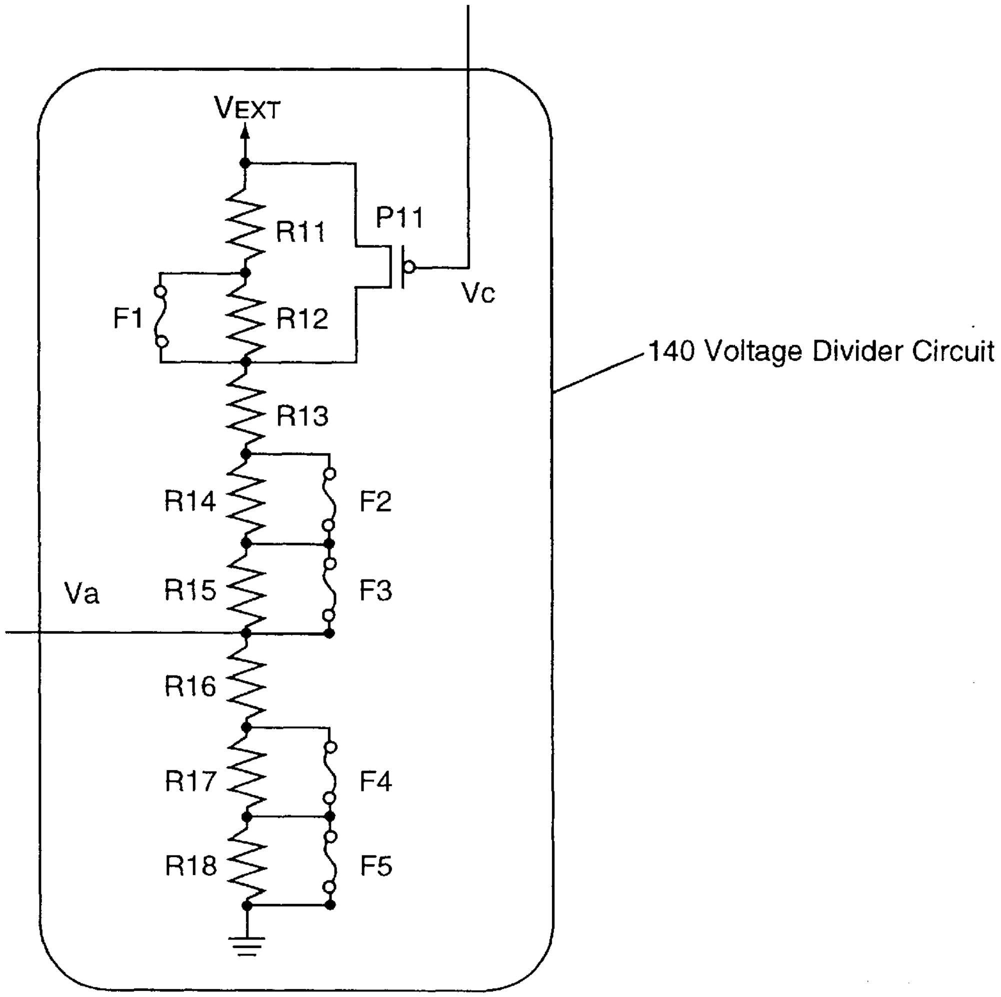
FIG. 3 is a circuit diagram depicting a voltage divider circuit employed in the first embodiment shown in FIG. 1, which is capable of adjusting a voltage division ratio.

Incidentally, the configuration of the voltage divider circuit 120 is not necessarily limited to the above. For example, the change of the voltage division ratio may be done by short-circuiting the resistor R5 with the PMOS transistor P4. Further, the same operation as described above can be performed by separating the resistor R6 from others and opening/short-circuiting one of the separated resistors using an NMOS transistor. The load elements R4 through R6 are not necessarily limited to the resistors. For example, diode-connected MOS transistors or the MOS transistors connected in series may be used in place of the resistor R5. The switch element P4 is not necessarily limited to the MOS transistor. Namely, any one may be used if capable of changing the voltage division ratio by forming the external source-side load circuit inserted between the external source or voltage and the fractionally-divided voltage output terminal and the ground source-side load circuit inserted between the ground source or voltage and the fractionally-divided voltage output terminal using three or more load elements and by opening/short-circuiting a predetermined load element with a switch element. Further, a voltage divider circuit 140 shown in FIG. 3 may be used which is capable of adjusting the first voltage division ratio and the second voltage division ratio. In the voltage divider circuit 140 shown in FIG. 3, series-connected resistors R11 through R15 form an external source-side load circuit, whereas series-connected resistors R16 through R18 constitute a ground source-side load circuit. A PMOS transistor P11, which serves as a switch element, is provided in parallel to a series resistor composed of the resistors R11 and R12. Further, adjusting fuses F1 through F5 cuttable by the irradiation of a laser beam or the like are respectively provided in parallel with the resistors R12, R14, R15, R17 and R18. The first and second voltage division ratios can be simultaneously adjusted by cutting out any of the adjusting fuses F2 through F5. The first voltage division ratio (corresponding to the voltage division ratio at the time that the transistor P11 is OFF) can be singly adjusted by cutting out or opening the fuse F1.

Further, the configuration of the burn-in voltage generator 150 is not necessarily limited to the above. The burn-in voltage generator 150 may be configured so that the PMOS transistor P5 corresponding to the switch element is provided between the resistor R3 and the output terminal INTB without being provided between the external voltage and the resistor R3 corresponding to the step-down load element. Alternatively, the burn-in voltage generator 150 may be configured so as to directly output the external voltage with the resistor R3 as on. Further, the burn-in voltage generator 150 is not necessarily limited to one shown in FIG. 1. The switch element is not limited to the PMOS transistor. Moreover, the step-down load element is not limited to the resistor. As an alternative to the resistor, for example, diode-connected MOS transistors or the MOS transistors connected in series may be used as the step-down load element.

Further, the configuration of the amplifier circuit 110 is not necessarily limited to the above. Alternatively, the amplifier circuit 110 may be constructed such that a switch element brought into conduction when the decision voltage Vc is "H" and opened when the decision voltage Vc is "L", is provided between the point of connection between the PMOS transistor P3 and the resistor R1 and the output terminal INTN without using the point of connection between the PMOS transistor P3 and the resistor R1 as the output terminal INTN.

A second embodiment of the present invention will next be described.

Figure 4:
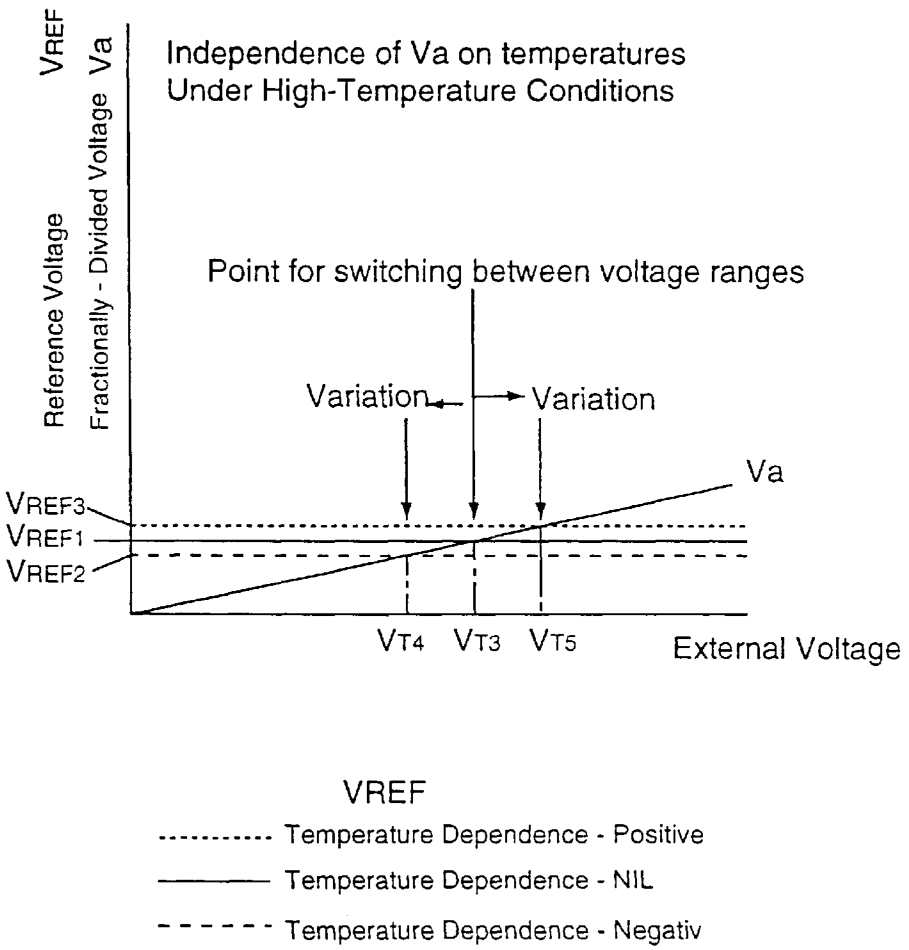
FIG. 4 is a diagram for describing variations in boundary voltage with respect to temperatures.

When a reference voltage VREF has a dependence on the temperature where an internal voltage generating circuit is activated under a high temperature, an external voltage point (boundary voltage) at which a voltage section or range is changed due to its dependence, varies. FIG. 4 is a diagram for describing a temperature-dependence of a boundary voltage at the time that VREF is dependent on the temperature and a fractionally-divided voltage Va (i.e., a voltage division ratio of a voltage divider circuit) is independent on the temperature. Now consider that the value of the reference voltage VREF at the time that the internal voltage generating circuit is activated at ordinary temperatures is VREF1 in FIG. 4. In this case, a boundary voltage corresponding to an external voltage value that satisfies Va=VREF1 indicative of a voltage-range switch condition, is represented as VT3. Next consider that when the internal voltage generating circuit is activated at high temperatures, the reference voltage depends on a negative temperature and the reference voltage is lowered to VREF2. Since the boundary voltage becomes VT4 by doing so, the voltage range is changed at an external voltage lower than a desired voltage value VT3. Now consider to the contrary that the reference voltage is dependent on a positive temperature and the reference voltage is raised to VREF3. Since the boundary voltage becomes VT5 in this case, the voltage range is changed at an external voltage higher than the desired voltage value VT3. The same as described above can be said of the internal voltage generating circuit shown in FIG. 1. It is basically desirable that the point (boundary voltage) of switching between the voltage ranges is not dependent on the temperature.

Thus, the internal voltage generating circuit according to the second embodiment is characterized by imparting such a temperature characteristic as to correct variations in the first and second boundary voltages VT1 and VT2 with respect to temperature, to the fractionally-divided voltage Va corresponding to the output voltage of the voltage divider circuit 120 when the reference voltage VREF produced from the reference voltage generator 100 in the internal voltage generating circuit shown in FIG. 1 varies with temperature. Namely, the internal voltage generating circuit according to the second embodiment is characterized in that the above temperature characteristic is imparted to the fractionally-divided voltage Va by setting a temperature coefficient of the external source-side load circuit composed of the resistors R4 and R5 in the voltage divider circuit 120 shown in FIG. 1 and a temperature coefficient of the ground source-side load circuit composed of the resistor R6 in the voltage divider circuit 120 to different values respectively.

In general, resistive elements have positive temperature coefficients and are different from each other in temperature coefficient ranges settable according to the material. For example, a temperature coefficient of an n-type or p-type diffusion layer (hereinafter called simply "diffusion layer") composed of silicon is normally larger than that of polysilicon. The temperature coefficients of the diffusion layer and the polysilicon can be respectively set within a predetermined range in accordance with an impurity concentration, a production process, etc. Therefore, the resistors R4 through R6 are formed using the diffusion layer or the polysilicon.

When the reference voltage VREF has a dependence on a negative temperature, the diffusion layer is used for the resistors R4 and R5 and the polysilicon is used for the resistor R6 so as to impart the negative temperature-dependence to the fractionally-divided voltage Va. Further, the temperature coefficients of the resistors R5 and R6 are respectively set in such a manner that a variation in the voltage Va2 with respect to the temperature under a second voltage division ratio at the time that the external voltage is of the first boundary voltage VT1, becomes equal to the variation in VREF with respect to the temperature. Next, the temperature coefficient of the resistor R4 is set such that a variation in fractionally-divided voltage Va1 with respect to the temperature under a first voltage division ratio at the time that the external voltage is of the second boundary voltage VT2, becomes equal to the variation in VREF with respect to the temperature . At this time, the temperature coefficient of the resistor R6 is smaller than the temperature coefficients of the resistors R4 and R5.

On the other hand, when the reference voltage VREF has a dependence on a positive temperature, the polysilicon is used for the resistors R4 and R5 and the diffusion layer is used for the resistor R6. Further, the temperature coefficients of the resistors R4 through R6 are set such that the temperature variation in Va2 at the first boundary voltage VT1 and the temperature variation in Va1 at the second boundary voltage VT2 are respectively equal to the temperature variation in VREF. At this time, the temperature coefficient of the resistor R6 is larger than the temperature coefficients of the resistors R4 and R5.

Figure 5:
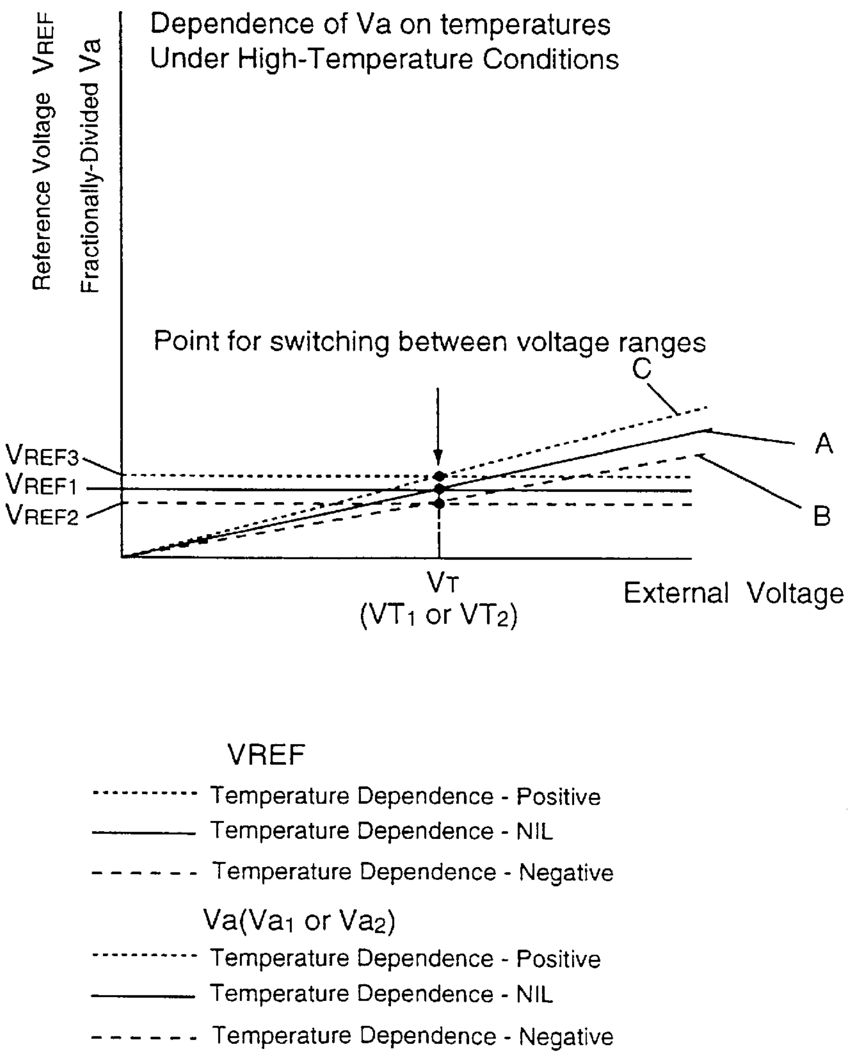
FIG. 5 is a diagram for describing the operation for correcting a boundary voltage with respect to variations in temperature, which occur in a second embodiment of the present invention.

Next, FIG. 5 is a diagram for describing the operation for correcting boundary voltages (corresponding to the first and second boundary voltages VT1 and VT2) with respect to temperature variations in the internal voltage generating circuit according to the second embodiment of the present invention. Now consider in FIG. 5 that the value of a reference voltage VREF at the time that the internal voltage generating circuit is activated under ordinary temperatures, is VREF1 and the characteristic of a voltage Va obtained by making a fraction of an external voltage is represented as A in the drawing. A boundary voltage (VT1 or VT2) at this time is defined as VT.

Let's next consider that the reference voltage VREF is dependent on a negative temperature and is lowered to VREF2 when the internal voltage generating circuit is activated under a high temperature. Since the voltage Va (Va1 or Va2) is set so as to have a negative temperature-dependence at this time, the characteristic of the voltage Va with respect to the external voltage changes from A to B in the drawing. The external voltage, i.e., the boundary voltage that satisfies Va=VREF2 indicative of the condition for switching between voltage sections or ranges, rises with a variation in characteristic of Va so as to be corrected to the same VT as when the internal voltage generating circuit is activated under ordinary temperatures.

Now consider to the contrary that when the internal voltage generating circuit is activated under the high temperature, the reference voltage VREF is dependent on the negative temperature and is increased to VREF3. Since the voltage Va (Va1 or Va2) is set so as to have a positive temperature-dependence at this time, the characteristic of the voltage Va with respect to the external voltage changes from A to C in the drawing. Thus, the boundary voltage is reduced so as to be corrected to the same VT as when the internal voltage generating circuit is activated under ordinary temperatures.

According to the second embodiment as described above, the respective resistors of the voltage divider circuit 120 are respectively formed of materials having different temperature coefficients. Thus, as presented in Table 1 shown below, when the reference voltage VREF is dependent on the negative temperature, the temperature coefficient of the resistor R6 is set so as to be smaller than the temperature coefficients of the resistors R4 and R5, whereas when the reference voltage VREF is dependent on the positive temperature, the temperature coefficient of the resistor R6 is set so as to be larger than the temperature coefficients of the resistors R4 and R5. Further, such an output vs. temperature characteristic that the variation in the voltage Va2 with respect to the temperature at the time that the external voltage is of the first boundary voltage VT1 and the variation in the voltage Va1 with respect to the temperature at the time that the external voltage is of the second boundary voltage, become equal to the variation in the reference voltage with respect to the temperature, is imparted to the voltage divider circuit 120. It is thus possible to correct temperature variations in the first and second boundary voltages due to the variation in the reference voltage with respect to the temperature.

TABLE 1

| Dependence of VREF on temperature | Negative | Positive |
|---|---|---|
| Temperature coefficient of R4 | Large | Small |
| Temperature coefficient of R5 | Large | Small |
| Temperature coefficient of R6 | Small | Large |

Figure 6:
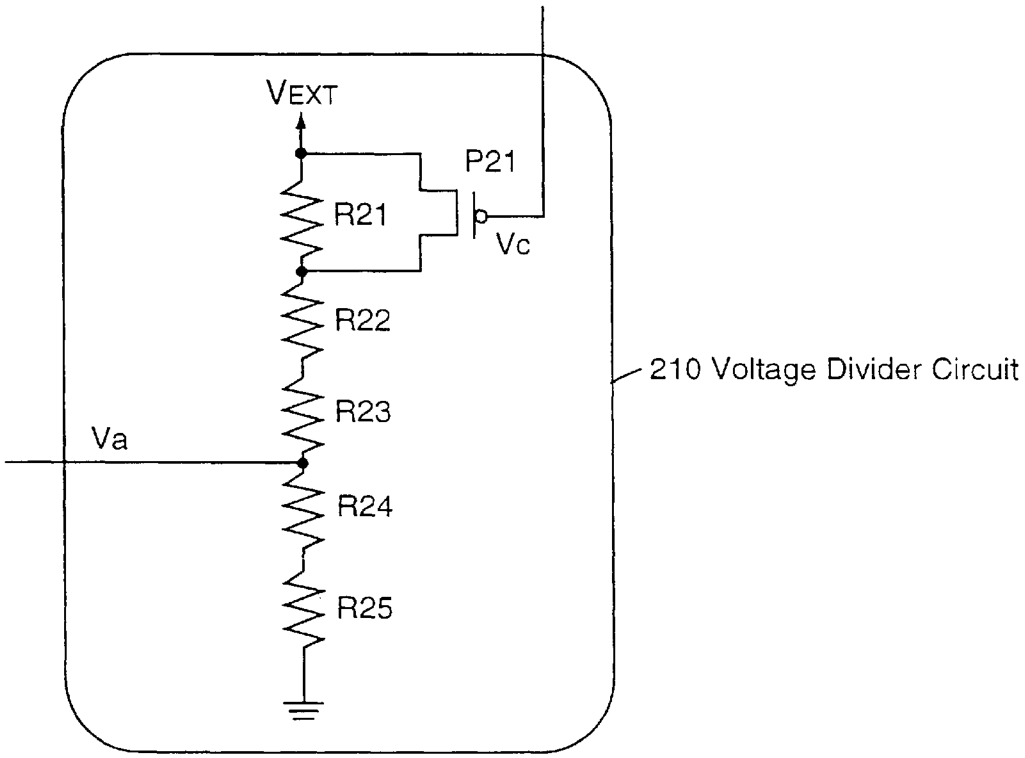
FIG. 6 is a circuit diagram showing another voltage divider circuit employed in the second embodiment of the present invention.
Figure 7:
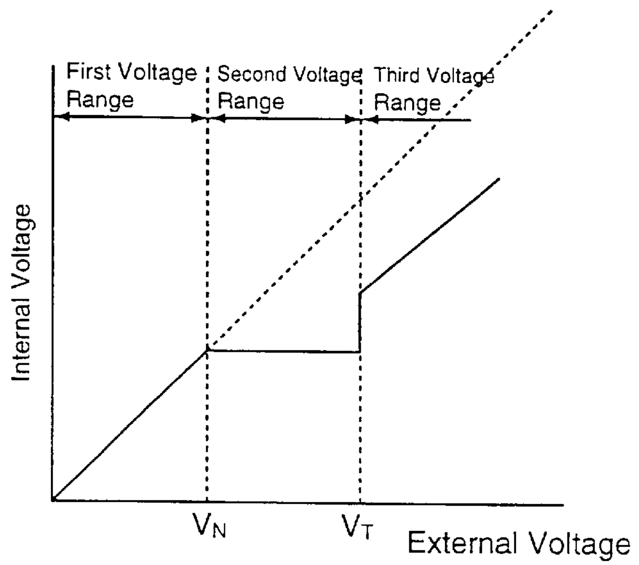
FIG. 7 is a diagram illustrating an output voltage characteristic of an internal voltage generating circuit descriptive of a related art.

Incidentally, a voltage divider circuit 120 shown in FIG. 6 is used as the above-described voltage divider circuit and the variations in the boundary voltage with respect to the temperature may be corrected in the following manner. In FIG. 6, series-connected resistors R21 through R23 constitute an external source-side load circuit and series-connected resistors R24 and R25 constitute a ground source-side load circuit. A PMOS transistor P21, which serves as a switch element, is provided in parallel with the resistor R21. Resistive materials having different temperature coefficients are respectively used for the resistors R22 and R23 and the resistors R24 and R25. For example, the resistors R22 and R24 are respectively formed of a diffusion layer and the resistors R23 and R25 are respectively formed of polysilicon. Thus, since a temperature characteristic of a fractionally-divided voltage Va2 at a second voltage division ratio can be controlled by adjusting the ratio between the resistance values of the resistors R22 and R23 and the ratio between the resistance values of the resistors R24 and R25, the degree of freedom of the control on the temperature characteristic of Va2 can be enlarged. It is of course possible to form the external source-side load circuit (resistors R22 and R23) of the diffusion layer and form the ground source-side load circuit (resistors R24 and R25) of polysilicon or vice versa. It is needless to say that the degree of freedom of the control on a temperature characteristic of a fractionally-divided voltage Va1 at a first voltage division ratio can be made great by dividing the resistor R21 controlled by the PMOS transistor P21 into resistors and respectively forming the divided resistors from resistive materials having different temperature coefficients.

According to the internal voltage generating circuit of the present invention as has been described above, an advantageous effect can be brought about in that since a hysteresis characteristic is imparted to an internal voltage by switching the characteristic of an internal voltage from a constant voltage characteristic to a variable voltage characteristic when an external voltage is of a second boundary voltage and switching the characteristic of the internal voltage from the variable voltage characteristic to the constant voltage characteristic when the external voltage is of a first boundary voltage smaller than the second boundary voltage, a stable internal voltage can be outputted even when the external voltage is unstable in the vicinity of a characteristic changeover. Another advantageous effect can be brought about in that an external voltage range brought to the constant voltage characteristic and an external voltage range brought to the variable voltage characteristic can be both enlarged as compared with the prior art.

A further advantageous effect can be brought about in that variations in first and second boundary voltages with respect to the temperature due to a variation in reference voltage with respect to the temperature can be corrected by freely setting the dependence of a voltage division ratio of a voltage divider circuit on the temperature.

A still further advantageous effect can be brought about in that a voltage division ratio of a voltage division load circuit can be adjusted by opening or cutting out adjusting fuses so as to free short-circuiting of predetermined load elements.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An internal voltage generating circuit for generating an internal voltage from an external voltage applied to an external terminal, the circuit comprising a reference voltage generator for generating a reference voltage;

a constant voltage generator, coupled to the reference voltage generator, for generating a constant voltage based on the reference voltage;

a variable voltage generator for generating a variable voltage which is larger than the constant voltage and increases linearly with an increase in the external voltage;

an output circuit for outputting the internal voltage, wherein the generated internal voltage is the constant voltage when the external voltage is in a lower voltage range, and wherein the generated internal voltage is the variable voltage when the external voltage is in a upper voltage range higher than the lower voltage range, a boundary voltage being defined between the lower voltage range and the upper voltage range, the boundary voltage being a first boundary voltage when the internal voltage is the variable voltage and being a second boundary voltage higher than the first boundary voltage when the internal voltage is the constant voltage;

detecting circuit connected to the external terminal, for detecting the level of the external voltage, outputting a determination signal having a first logical value or a second logical value, changing the value of the determination signal from the first logical value to the second logical value when the detecting circuit detects that the level of the external voltage has risen from within the lower voltage range to at least the second boundary voltage, and changing the value of the determination signal from the second logical value to the first logical value when the detecting circuit detects that the level of the external voltage has been reduced from within the upper voltage range at least to the first boundary voltage; and a voltage circuit connected to the detecting circuit and the output circuit, for providing the constant voltage to the output circuit when the determination signal has the first logical value, and for providing the variable voltage to the output circuit when the determination signal has the second logical value.

2. An internal voltage generating circuit for generating an internal voltage from an external voltage applied to an external terminal, comprising:

a constant voltage generator for generating a constant voltage based on the external voltage applied to an external terminal;

a variable voltage generator for generating a variable voltage based on the external voltage, the variable voltage being larger than the constant voltage and increasing linearly with an increase in the external voltage;

a setting circuit, connected to the external terminal, setting the internal voltage at the level of the constant voltage when the external voltage is in a first voltage range, and setting the internal voltage at the level of the variable voltage when the internal voltage is in a second voltage range higher than the first voltage range, wherein a boundary voltage value between the first and second voltage ranges is a first value when the external voltage is in the first voltage range and is a second value lower than the first value when the external voltage is in the second voltage range, so that while the internal voltage is set at the level of the constant voltage, the setting circuit switches the internal voltage to the level of the variable voltage only when the external voltage increases to the first value, and while the internal voltage is set at the level of the variable voltage, the setting circuit switches the internal voltage to the level of the constant voltage only when the external voltage falls to the second value.

3. An internal voltage generating circuit as claimed in claim 1, wherein said detecting circuit includes:

a voltage divider circuit for making a fraction of the external voltage in a first voltage division ratio when the determination signal has the first logical value, making a fraction of the external voltage in a second voltage division ratio when the determination signal has the second logical value and outputting either one of the resultant fractional voltages therefrom, and a comparing circuit for comparing the level of the reference voltage and that of said fractional voltage, outputting the determination signal with the first logical value when said fractional voltage is less than the reference voltage and outputting the determination signal with the second logical value when the fractional voltage is greater than the reference voltage, and said voltage divider circuit sets the first voltage division ratio so that the fractional voltage becomes equal to the reference voltage when the external voltage is equal to the second boundary voltage and is fractionated in the first voltage divisional ratio, and sets the second voltage division ratio so that the fractional voltage becomes equal to the reference voltage when the external voltage is equal to the first boundary voltage and is fractionated in the second voltage division ratio.

4. An internal voltage generating circuit as claimed in claim 3, wherein the first and second voltage division ratios made by said voltage divider circuit are dependent on temperature.

5. An internal voltage generating circuit as claimed in claim 3, wherein said voltage divider circuit includes:

a voltage division load circuit wherein three or more load elements are connected in series, opposite ends of the series-connected load elements are respectively connected to the external voltage and a ground voltage, and any of points at which the load elements are joined to each other[,] is used as an output terminal for outputting the fractional voltage, whereby the external voltage is fractionally-divided by an external source-side load circuit extending from the external voltage to the output terminal and a ground source-side load circuit extending from the output terminal to the ground voltage, and a switch circuit for short-circuiting or opening a predetermined one of said loads in accordance with the determination signal to thereby set a voltage division ratio of said voltage division load circuit to said first or said second voltage division ratio.

6. An internal voltage generating circuit as claimed in claim 5, wherein said voltage division load circuit uses resistors as the load elements.

7. An internal voltage generating circuit as claimed in claim 6, wherein said external source-side load circuit and said ground source-side load circuit include resistors formed of resistive materials of two types or more, which are different in temperature coefficient from each other, so that the voltage division ratio is dependent on temperature.

8. An internal voltage generating circuit as claimed in claim 6, wherein said voltage division load circuit includes a plurality of resistors, respectively provided for said external source-side load circuit and said ground source-side load circuit, and formed from resistive materials of two types or more, which are different in temperature coefficient from each other, so that the voltage division ratio is dependent on temperature.

9. An internal voltage generating circuit as claimed in claim 8, wherein said voltage division load circuit uses polysilicon and an n- or p-type silicon diffusion layer as the resistive materials.

10. An internal voltage generating circuit as claimed in any of claim 5, wherein said switch circuit has one or a plurality of short-circuit switch elements connected in parallel with the load elements to be short-circuited of said voltage division load circuit and is activated so as to bring said short-circuit switch elements into conduction or non-conduction in accordance with the determination signal.

11. An internal voltage generating circuit as claimed in claim 10, wherein said switch circuit uses a MOS transistor as the short-circuit switch element.

12. An internal voltage generating circuit as claimed in any of claim 5, wherein said voltage divider circuit further includes adjusting fuses for short-circuiting between the terminals of the predetermined load element of said load elements and is able to adjust the voltage division ratio of said voltage division load circuit by cutting out any of said adjusting fuses.

13. An internal voltage generating circuit as claimed in any of claim 3, wherein said comparing circuit includes, a comparator having an inverse input terminal and a non-inverse input terminal respectively supplied with the reference voltage and the fractional voltage, and a drive circuit driven in response to a signal outputted from said comparator so as to output the determination signal.

14. An internal voltage generating circuit as claimed in any of claim 1, wherein said variable voltage generator has an output terminal connected to an input terminal of said output circuit and is activated so as to output the variable voltage to said output circuit when the determination signal has the second logical value and deactivated so as to stop the output of the variable voltage to said output circuit when the determination signal has the first logical value and said constant voltage generator has an output terminal connected to the input terminal of said output circuit and is activated so as to output the constant voltage to said output circuit when said variable voltage generator stops outputting, and deactivated so as to stop the output of the constant voltage to said output circuit when said variable voltage generator is activated.

15. An internal voltage generating circuit as claimed in claim 14, wherein said variable voltage generator includes:

a switch element having a control terminal inputted with the determination signal, said switch element being opened when the determination signal has the first logical value and being brought into conduction when the determination signal has the second logical value, and a step-down load element connected in series with said switch element; and said constant voltage generator includes:

a differential amplifier having an inverse input terminal supplied with the reference voltage, a first step-up load element provided between a non-inverse terminal of said differential amplifier and the input terminal of said output circuit, a second step-up load element provided between the non-inverse terminal of said differential amplifier and a ground voltage, and a PMOS transistor whose gate, source and drain electrodes are respectively connected to an output terminal of said differential amplifier, the external voltage and the input terminal of said output circuit, said PMOS transistor being cut off when said switch element is brought into conduction so as to activate said constant voltage generator.

16. In an internal voltage generating circuit for generating an internal voltage from an externally applied voltage, the internal voltage generating circuit being responsive to the externally applied voltage to provide the internal voltage at a constant voltage level when the externally applied voltage is in a first voltage range, and to provide the internal voltage at a variable voltage level, larger than the constant voltage level and increasing linearly with an increase in the external voltage, when the externally applied voltage is in a second voltage range higher than the first voltage range, a boundary voltage defining a boundary between the first and second voltage ranges, the improvement comprising:

means for setting the boundary voltage at a first boundary value when the externally applied voltage is in the first voltage range and setting the boundary voltage at a second boundary value below the first boundary value when the externally applied voltage is in the second voltage range; and means for switching the internal voltage from the constant voltage level to the variable voltage level only when the externally applied voltage increases to the first boundary value, and for switching the internal voltage from the variable voltage level to the constant voltage level only when the externally applied voltage falls to the second boundary value.

17. In a semiconductor device that includes an internal voltage generating circuit for generating an internal voltage from an externally applied voltage, the internal voltage generating circuit being responsive to the externally applied voltage to provide the internal voltage at a constant voltage level when the externally applied voltage is in a first voltage range and to provide the internal voltage at a variable voltage level, larger than the constant voltage level and increasing linearly with an increase in the external voltage, when the externally applied voltage is in a second voltage range higher than the first voltage range, a boundary voltage defining a boundary between the first and second voltage ranges, the improvement comprising:

means for setting the boundary voltage at a first boundary value when the externally applied voltage is in the first voltage range and setting the boundary voltage at a second boundary value below the first boundary value when the externally applied voltage is in the second voltage range; and means for switching the internal voltage from the constant voltage level to the variable voltage level only when the externally applied voltage increases to the first boundary value, and for switching the internal voltage from the variable voltage level to the constant voltage level only when the externally applied voltage falls to the second boundary value.

* * * * *